United States Patent
Mizuno et al.

(10) Patent No.: US 6,370,494 B1
(45) Date of Patent: Apr. 9, 2002

(54) SIMULATOR AND COMPUTER-READABLE RECORDABLE MEDIUM HAVING PROGRAM FOR EXECUTION ON COMPUTER REALIZING THE SIMULATOR RECORDED THEREON

(75) Inventors: Masanobu Mizuno; Hiroshi Takahashi, both of osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/241,261

(22) Filed: Feb. 1, 1999

(30) Foreign Application Priority Data

Feb. 5, 1998 (JP) ............................................ 10-024905

(51) Int. Cl.[7] ............................. G06F 9/455; G06F 3/00
(52) U.S. Cl. .............................. 703/17; 714/741; 716/4
(58) Field of Search .............................. 703/17, 13, 14, 703/15, 21, 19; 714/724, 741; 716/4

(56) References Cited

U.S. PATENT DOCUMENTS

| | | | |
|---|---|---|---|
| 5,146,460 A | * 9/1992 | Ackerman et al. | 714/33 |
| 5,539,652 A | * 7/1996 | Tegethoff | 703/14 |
| 5,546,562 A | * 8/1996 | Patel | 703/14 |
| 5,696,942 A | * 12/1997 | Palnitkar et al. | 703/17 |
| 6,061,283 A | * 5/2000 | Takahashi et al. | 365/201 |

OTHER PUBLICATIONS

Fujioka et al., H. TAT—and Cost–reduction Strategies in LSI Manufacturing Test Process, 1999 IEEE/SEMI Advanced Semiconductor Manufacturing Conference and Workshop, pp. 59–63.*

Naganuma et al., J. High–Level Design Validation Using Algorithmic Debugging, European Design and Test Conference. EDAC, The European Conference Design Automation. ETC, European Test Conference. EUROASIC, The European ASIC Design, 1994, pp. 474–480.*

Gennart et al., B.A. Validating Discrete Event Simulations Using Event Pattern Mapping, Design Automation Conference, 29th ACM/IEEE, 1992, pp. 414–419.*

Dabrowski, J. Design of Multilevel Mixed–Mode Simulator for LSI/VLSI Circuits, IEEE International Symposium on Circuits and Systems, 1998, pp. 1635–1638.*

* cited by examiner

Primary Examiner—Russell W. Frejd
(74) Attorney, Agent, or Firm—Merchant & Gould P.C.

(57) ABSTRACT

A simulator capable of counting a number of events occurring in each of functional modules constituting an LSI and calculating an index value for selecting a simulation method for each functional module in simulation of an operation of the LSI with a first test vector set. The simulator further capable of selecting one simulation method among a plurality of simulation methods for each functional module based on the selection index value, and of controlling execution of simulation of the LSI operation with a second test vector set in the simulation method selected for each functional module.

8 Claims, 13 Drawing Sheets

| Signal name | The number of events |
|---|---|
| 41 | 350 |
| 42 | 200 |
| 43 | 200 |
| 44 | 2000 |
| 45 | 100 |
| 46 | 130 |
| 47 | 70 |
| 48 | 100 |
| 49 | 100 |
| 410 | 100 |
| 411 | 100 |
| 412 | 100 |
| 413 | 100 |

SIMULATOR AND COMPUTER-READABLE RECORDABLE MEDIUM HAVING PROGRAM FOR EXECUTION ON COMPUTER REALIZING THE SIMULATOR RECORDED THEREON

BACKGROUND OF THE INVENTION

1. Field of the Invention

The present invention relates to a system-level functional logic simulating technique used for design verification of a large-scale system LSI with a plurality of functional modules.

2. Description of the Prior Art

The development of miniaturization and integration technology of LSIs has allowed a large-scale integrated circuit on a system level to be integrated on one LSI chip. In the development of such a system LSI, it is necessary to design for a system LSI top-down while verifying the processing system design, the function operation, the logic and the layout step by step so that the system LSIs can be produced in a short period of time. With the growth of the design scale, improvements on the design technique are required in design techniques and automated design techniques. In particular, techniques for efficient verification of the functional operation of one LSI chip system are required. The functional verification is generally performed by simulation on a general-purpose computer using a circuit description verifier in a hardware description language that utilizes test vectors. Since the simulation time of LSIs increases exponentially with the enlargement of the circuit scale, it is essential to speed up this simulation. High speed is particularly required in simulation for functional verification for one chip, because circuits with several millions of gates are tested routinely. Currently it is estimated to take several weeks to a month or more to complete the verification. Thus, it is very important to achieve high speed in various simulations.

Event-driven simulation and cycle-based simulation are well-known as simulation methods. In the event-driven simulation, a signal is traced from its input to a circuit throughout the path to where the signal is routed so as to monitor signal value changes in the circuit, which are commonly referred to as events. Thus, the changes in the circuit status are calculated. In the cycle-based simulation, using a clock signal as a reference, all the changes in the status of the circuit are calculated in relation to a signal value transition of the clock signal. In view of the simulation processing rate, the cycle-based simulation is generally faster, because synchronous circuit design with a clock signal provided is the mainstream. In the event-driven simulation, additional processing is performed to trace events. When simulating the operation of a circuit having signal value changes only in a part of the circuit, calculation is performed only with respect to the operation in the part of the circuit selected based on the events. Therefore, the event-driven simulation is efficient in this case. In addition, in the event-driven simulation, asynchronous circuit operation can be simulated. However, when simulating a synchronous circuit where changes in signal values are effected in the entire circuit at a time defined by the clock signal, the event-processing becomes an overhead. For this reason, the cycle-based simulation can be faster.

As described above, the cycle-based method is effective to simulate a synchronous circuit in high speed. For the simulation of a large-scale system LSI, there are an apparatus and a method, where the functional modules constituting the system LSI on one chip are simulated while a simulation method is selected for every functional module. Such an apparatus and a method are advantageous primarily because the functional modules constituting the system LSI are operated with different clock signals or include a memory or an input-output circuit section that operates asynchronously.

In the one chip simulation of the system LSI, all the functional modules are unlikely to operate equally. Typically, only specific functional modules operate actively, and other modules hardly operate. In view of high speed for simulation, the cycle-based method is advantageous for the simulation of the functional modules where many events occurs, and the event-driven method is advantageous for the simulation of the functional modules where events scarcely occurs.

However, there is a problem in that the conventional simulators or simulating methods for a system LSI have no means for providing a quantitative standard for selecting a simulation method appropriate to each functional module. More specifically, when selecting the simulation method, a designer who performs simulation only can judge from an estimate based on the design circuit or the specification of the test patterns. As a result, when the designer has selected an inappropriate simulation method, simulation takes a long time.

Furthermore, when simulating a complicated long-time operation of a circuit, it is likely that a functional module that has operated actively in an early stage of the simulation stops or hardly operates in the middle of the simulation. This occurs, for example in the simulation of a circuit that stops supplying a clock signal to specific functional modules in accordance with the operation mode, for the purpose of reducing power consumption. In order to simulate the operations from the supply to the stop of the clock signal in such a circuit at high speed by combining the simulation methods, it is necessary to change the simulation method for each functional module during the performance of the simulation in accordance with the operation status of the functional module, namely, the occurrence of events. However, there is no means for dynamically changing the simulation method that has been selected for each functional module during the performance of the simulation based on a quantitative standard, so that high-speed simulation cannot be performed.

SUMMARY OF THE INVENTION

Therefore, with the foregoing in mind, it is an object of the present invention to provide a simulator capable of determining and selecting a simulation method appropriate to each functional module so that high-speed LSI simulation can be performed.

In order to achieve the aforementioned object, a simulator of the present invention performs simulation with a small-scale test vector selected for a test before simulation with a desired test vector, so that a simulation method to be used for the simulation with a desired test is determined based on the event incident status of each function module of the LSI to be simulated. The small-scale test vector selected for the test is referred to as "first test vector set", and the desired test vector is referred to as "second test vector set".

A simulator of the present invention comprises means for counting the number of events occurring in each of functional modules constituting an LSI and means for calculating an index value for selecting a simulation method for each functional module in a particular simulation of the operation of the LSI with a first test vector set; means for selecting one simulation method among a plurality of simulation methods for each functional module based on the selection index value; and means for controlling execution of simulation of the LSI operating with a second test vector set in the simulation method selected for each functional module.

This embodiment makes it possible to select a simulation method appropriate to each module with a selection index value calculated based on the number of events occurring in each module. Thus, simulation can be performed in a higher speed.

In one embodiment of the simulator of the present invention, the plurality of simulation methods preferably comprise a cycle simulation method in which the functional modules are simulated in a clock signal cycle and an event-driven simulation method in which the functional modules are simulated in an event-driven manner. They are typical simulation methods.

In another embodiment of the simulator of the present invention, the number of events that has been counted during a predetermined period of time is preferably used as the selection index value. Switching the simulation method between the typical cycle simulation method and event-driven simulation method depending on the number of events allows high-speed simulation.

In still another embodiment of the simulator of the present invention, an event incident rate obtained by dividing the counted number of events by a product of the circuit scale of the functional module and the simulation unit time is more preferably used as the selection index value. Since a simulation method appropriate to each functional module is selected based on the event incident rate, the operation status of the circuit also can be judged in view of the scale of the functional module and the simulation time. This makes it possible to select a more appropriate simulation method, thus resulting in high-speed simulation as a whole.

In yet another embodiment of the simulator of the present invention, the control means preferably controls such that the simulation with the second test vector set is stopped temporarily after a predetermined period has lapsed; the selection index value is re-calculated; the simulation method for each functional module is selected among the plurality of simulation methods based on the recalculated selection index value; and the simulation of the LSI operation with the second test vector set that has been stopped temporarily is resumed.

In this embodiment, the selection index value for each module is re-calculated based on the operation status of LSI that is being simulated after every predetermined period during which simulation is executed, so that the simulation method is re-selected. Thus, in the case where the operation status is significantly changed in the simulation of the long-term and complicated operation of the circuit, it is possible to adopt an optimal simulation method in response to the change in the operation status.

In another embodiment of the simulator of the present invention, the selection index value calculating means preferably counts the number of events only with respect to an input signal. Since it is sufficient only to monitor the input signal, the simulation with the first test vector set can be performed at higher speed.

In still another embodiment of the simulator of the present invention, the selection index value calculating means preferably counts the number of events only with respect to a clock signal. Since it is sufficient only to monitor the clock signal, the simulation with the first test vector set can be performed at even higher speed.

According to another aspect of the present invention, a computer-readable recordable medium having a program for execution on a computer recorded thereon is provided. The program comprises the steps of counting the number of events occurring in each of functional modules constituting an LSI so as to calculate an index value for selecting a simulation method for each functional module in a particular simulation of an operation of the LSI with a first test vector set; selecting one simulation method among a plurality of simulation methods for each functional module based on the selection index value; and simulation the LSI operation with a second test vector set in the simulation method selected for each functional module.

When the program is loaded and executed on a computer, a simulation method appropriate to each functional module can be selected with the selection index value calculated based on the number of events occurring in each functional module. Thus, this invention achieves a simulator that can perform simulation at a higher speed.

As described above, according to the present invention, the event-driven simulation is performed with the short test vector in the first step so as to distinguish the functional modules on the basis of whether a large number of events occur or events scarcely occurs, or the entire module operates actively or only a part thereof operates. The cycle-based simulation is automatically performed for the former functional modules. On the other hand, the event-driven simulation is automatically performed for the latter functional modules. Thus, the simulation methods can be combined appropriately without the designer making detailed investigation on the characteristics of the circuit operation or the test vector for the simulation of a large-scale system LSI. Thus, simulation is performed in a shorter time.

Furthermore, in the case where a change in the operation status of the functional module such as the stop of the clock signal is effected during LSI simulation, it is possible to adopt an optimal simulation method in response to the change in the operation status. Thus, the simulation of the complicate operation of the large-scale LSI can be performed efficiently.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of embodiments with reference to the accompanying drawings.

Embodiment 1

Figure 1:
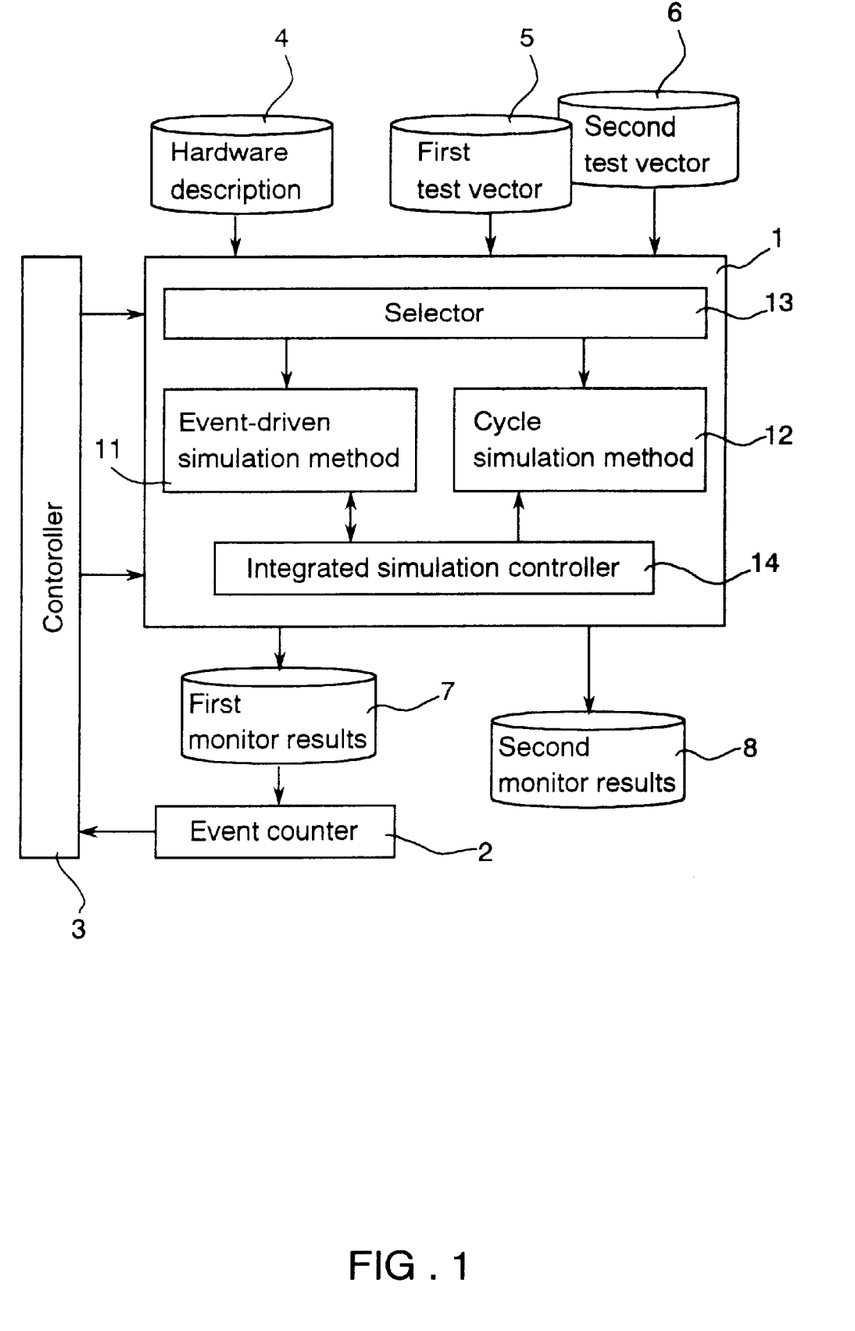
FIG. 1 shows the configuration of a simulator of Embodiment 1 of the present invention.

FIG. 1 shows the configuration of a simulator of Embodiment 1 of the present invention. A simulation method 1 for LSI simulation with the input of LSI circuit design results described in a hardware description language 4 and a test vector includes an event-driven simulation method 11 for compiling the hardware description 4 and executing simulation in the event-driven method and a cycle simulation method 12 for compiling the hardware description and executing simulation in the cycle-based method.

The simulation method 1 may include a plurality of simulation methods other than the event-driven simulation method 11 and the cycle simulation method 12. For example, the simulation method 1 can include a mixed simulation method in which the event-driven method and the cycle-based method are combined.

Furthermore, the simulation method 1 includes a selector 13 and an integrated simulation controller 14. The selector 13 sorts the input hardware description of the one LSI chip for every functional module either to the event-driven simulation method 11 or the cycle simulation method 12. The integrated simulation controller 14 controls the synchronization of the simulation by the event-driven simulation method and the cycle simulation method and the transmission of signals between the functional modules each of which is sorted out to either of the methods. These operations can be realized by techniques similar to a conventional software simulator.

An event counter 2 counts the number of events that occur in each functional module from the simulation results by the simulation method 1. More specifically, the event counter 2 counts changes in the signal value of each signal with respect to the monitored results of all the signal lines in the functional module. Regarding the number of the changes as the number of event of each signal, the event counter 2 calculates the total of the numbers of events of all the signals. FIG. 1 further shows a controller 3 for controlling the implementation of the simulation, hardware description 4 of a LSI circuit to be simulated, a first test vector set 5, a second test vector set 6, monitored results of simulation with the first test vector set 7 and monitored results of simulation with the second test vector set 8.

The first test vector set is used for the simulation of the circuit to be simulated 4 and is a signal supplied to an input signal to the circuit to be simulated 4. In Embodiment 1, a group of plurality of test vectors can be set as the first test vector set. Each of the test vectors is supplied to each of the functional modules constituting the circuit to be simulated 4. In one alternative embodiment, the configuration and the control can be such that part of the second test vector set is used as the first test vector set, thus eliminating the necessity of providing the first test vector set separately.

Figure 2:
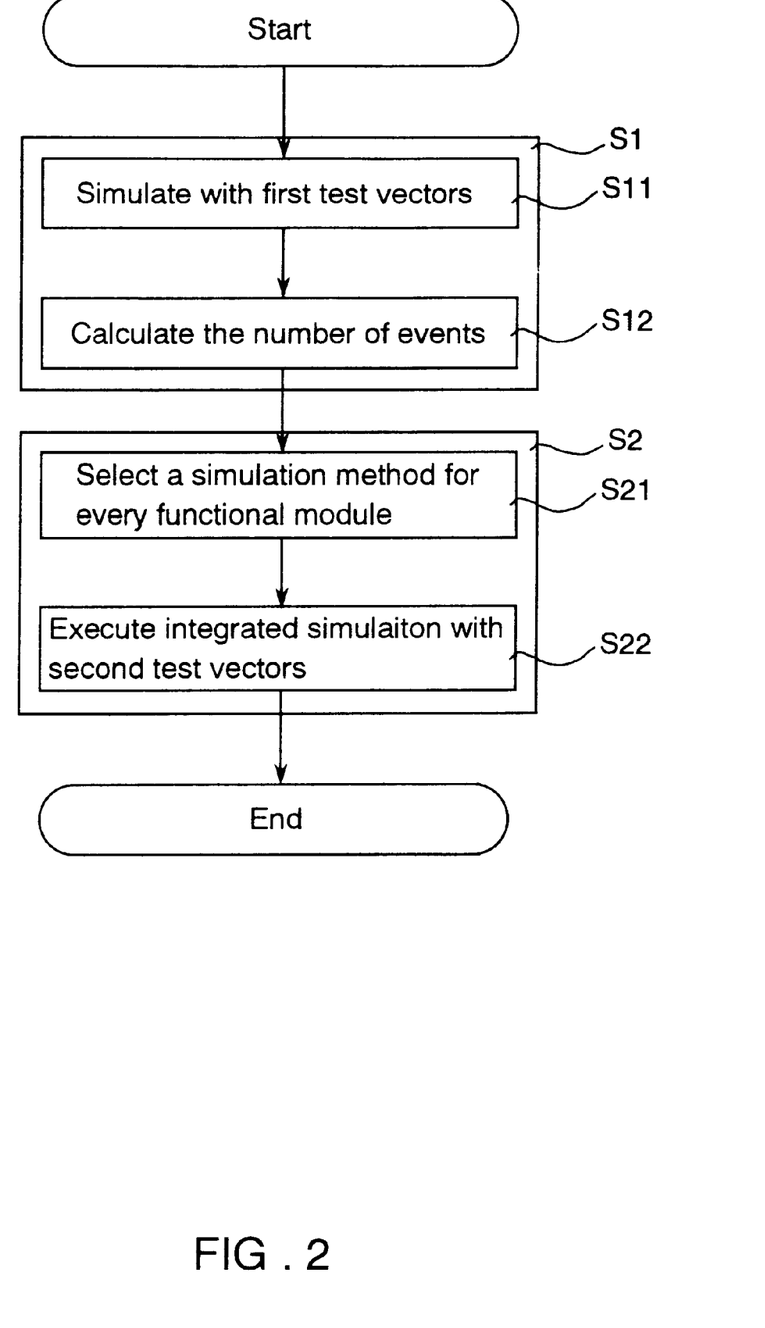
FIG. 2 is a flow chart of the simulation control of the simulator of Embodiment 1 of the present invention.

Next, the flow of the simulation control performed by the controller 3 shown in FIG. 1 will be described with reference to FIG. 2 below. Referring to FIG. 2, in the first step S1, simulation is performed with the first test vector set, and the number of events that occur in each functional module is counted. In the second step S2, a simulation method is selected for each functional module based on the number of events counted in step S1. Then, simulation is performed with the second test vector set. The first step S1 includes two steps S11 and S12. In step S11, simulation is performed with respect to all the functional modules that are input and hardware-described in the mode where signal value changes on all the signal lines of each functional module are monitored using the event-driven simulation method 11 as show in FIG. 1. Then, the monitored results are stored. Next, in step S12, the numbers of events on the signal lines are counted for each functional module and the total of the numbers is calculated.

Figure 3:
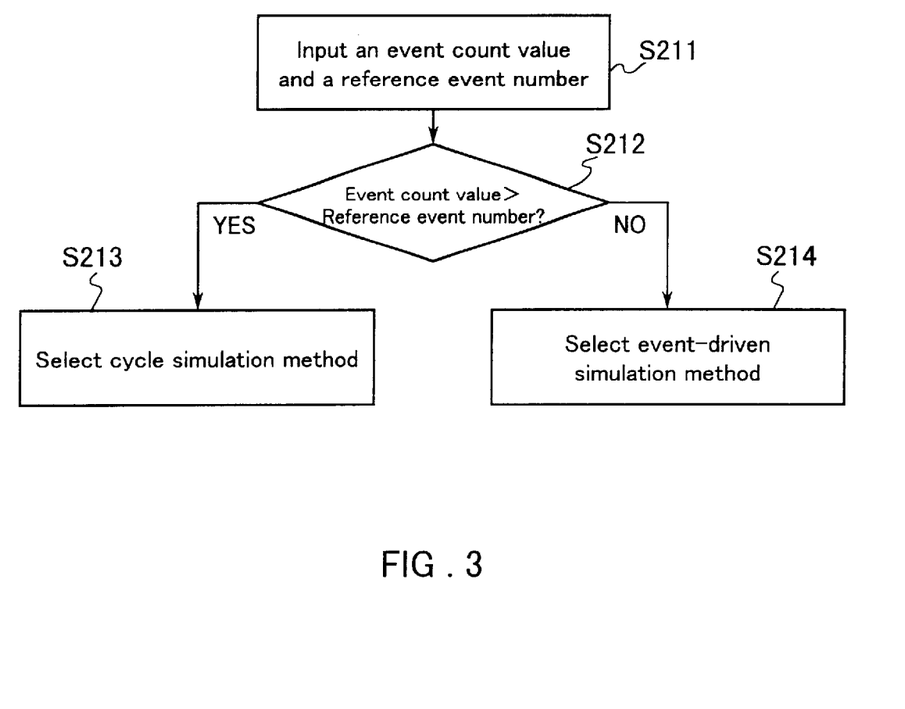
FIG. 3 is a flow chart of the simulation control of the simulator of Embodiment 1 of the present invention.

Then, the flow advances to step S2, which includes two steps S21 and S22. In step S21, a simulation method is selected for each functional module. FIG. 3 shows a detailed flow of the processing for each functional module. Referring to FIG. 3, the event count value and the reference value of the number of events are input in step S211 and compared in S212. In step S213, the cycle simulation method 12 is selected for the functional module having an event count value larger than the reference value of the number of events. In step S214, the event-driven simulation method 11 is selected for the other functional modules. In step S22 in FIG. 2, integrated simulation is performed by the event-driven simulation method 11 and the cycle simulation method 12.

Figure 4:
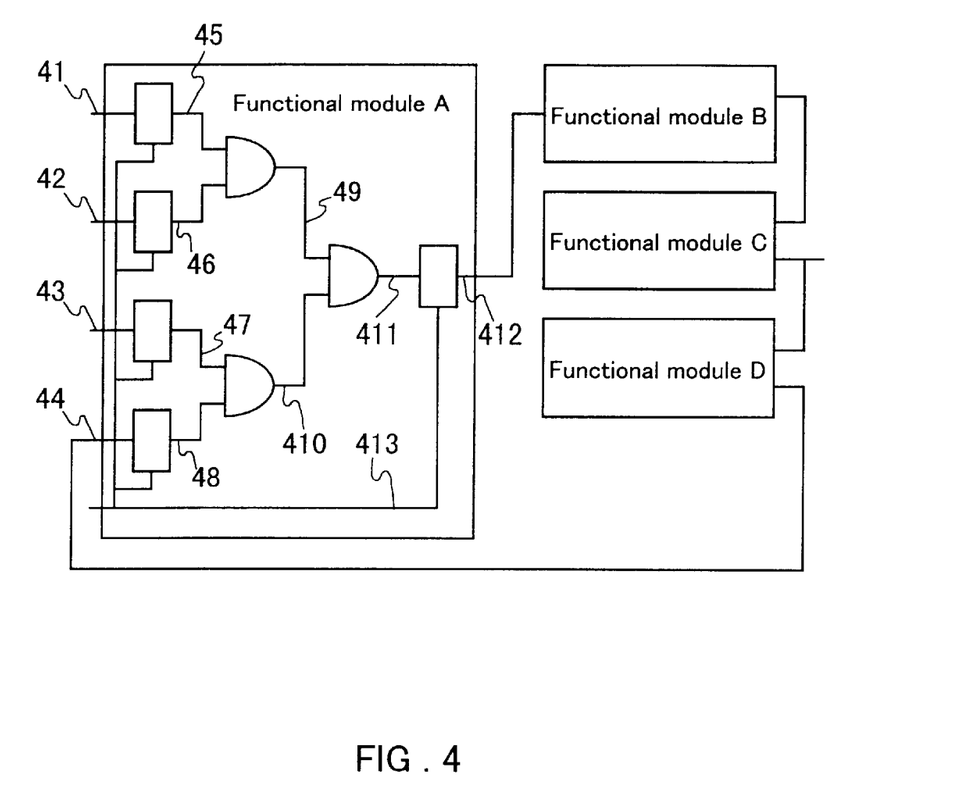
FIG. 4 shows illustrative circuits of an LSI for illustrating the operation of the simulator of Embodiment 1 of the present invention.

Next, the operation of Embodiment 1 will be described by way of a specific example. FIG. 4 is a diagram showing an example of a hardware description of a LSI to be simulated. The hardware description in FIG. 4 consists of four functional modules A, B, C, and D. The functional module A includes flip-flops and AND gates. The LSI with hardware description in FIG. 4 includes four input lines 41, 42, 43, 44. The first and second test vector sets are prepared with respect to these input lines. The first test vector set is a relatively short vector for counting the number of events of each of the functional modules in FIG. 4. The second test vector set is a vector for large-scale design verification, which is the original purpose.

The circuit being simulated in this example is constituted by small-scale simplified functional modules. However, this example is only illustrative and a circuit to be simulated can be a large-scale system LSI including functional modules on the order of a microcontroller, an image compression processing circuit such as MPEG, and circuit for encoding or decoding Reed-Solomon code or the like. Embodiment 1 can be used for simulation of such large-scale circuit.

In this embodiment, a pattern with about 1000 clock cycles is supplied to the first test vector set, and a pattern with 100,000 to 1,000,000 clock cycles is supplied to the second test vector set. A signal 44 in FIG. 4 is a clock signal. First, simulation is performed with respect to the circuit in FIG. 4 with the first test vector set using the event-driven simulation method 11 (the first step S1). In this case, all the signals of the functional modules A, B, C, and D are traced. For the functional module A, all the signals, i.e., signals 45 to 49 and signals 410 to 413 shown in FIG. 4, are traced. Simulation is performed, and the numbers of events for all the signals, namely, the numbers of changes in the signal values, are calculated for each functional module from the monitored results. The event count results with respect to the functional module A are shown in a table in FIG. 5. From the table in FIG. 5, when the sum of the numbers of events for all the signals is calculated, the event count value of the functional module A amounts to 3650. Similarly, the event count values of the functional modules B, C and D are 4000, 1900, and 200, respectively.

Next, a simulation method is selected based on the number of events of the functional module, and simulation is performed with the second test vector set (the second step S2). A reference value of the number of events (hereinafter, referred to as "reference event number") of 2000 is supplied. A simulation method is selected based on the event count values and the reference event number. For the functional module A, the event count value is 3650, which is larger than the reference event number of 2000. Therefore, the cycle simulation method is selected. Similarly, the cycle simulation method is selected for the functional module B. For the functional modules C and D, the event-driven simulation method is selected because the event count values are smaller than the reference event number.

According to the configuration and the procedures as described above, the event-driven simulation is performed with the short test vector in the first step so that the functional modules are distinguished on the basis of the number of events that occur in each functional module. The cycle-based simulation is automatically performed for the functional module that has been determined to have a large number of events. On the other hand, the event-driven simulation is automatically performed for the functional module that has been determined to have a small number of events. This embodiment allows the designer to perform simulation of the large-scale system LSI in a shorter time by combining the simulation methods appropriately without detailed investigation on the characteristics of the circuit operation or the test vector.

In the first step S1 in FIG. 2, the number of events can be counted only with respect to the input signals to the functional modules. In this case, the configuration and the procedure are the same as above. However, since only the input signals are monitored, the simulation in the first step can be performed faster and the data region required for the monitored results for counting events can be reduced.

Furthermore, in the first step S1 in FIG. 2, the number of events can be counted only with respect to the clock input signals to the functional modules. In this case, the configuration and the procedure is the same as above. In this embodiment, comparing with the preceding embodiment, the simulation in the first step can be performed even faster and the data region required for the monitored results for counting events can be reduced further. In the simulation in the second step S2, the simulation methods can be switched in response to the clock pulses or the stop of the clock signal. More specifically, in the case of the clock signal clock pulses, the cycle simulation can be performed, and in the case of the clock signal stop, the event-driven simulation can be performed.

Embodiment 2

Figure 6:
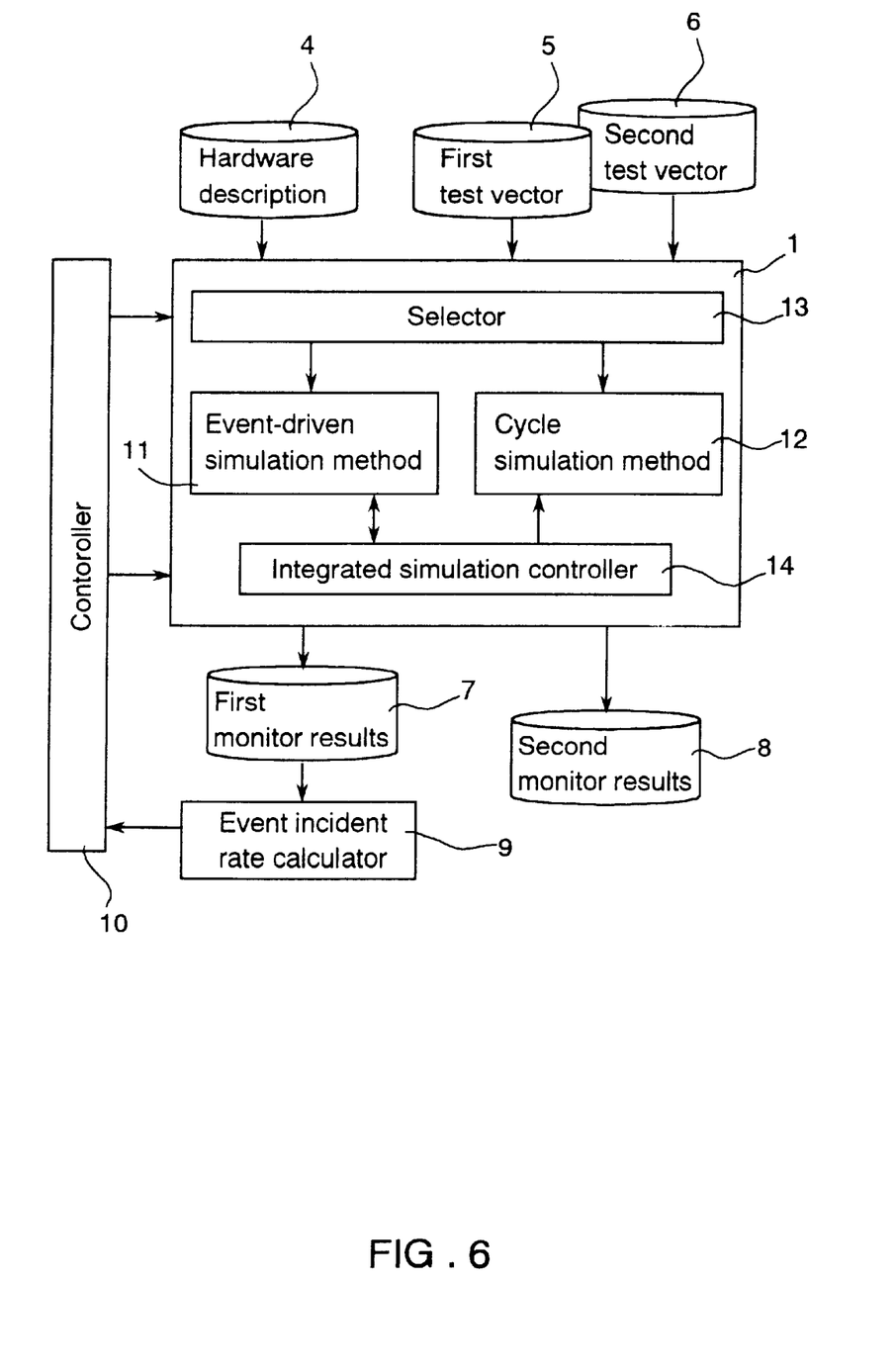
FIG. 6 shows the configuration of a simulator of Embodiment 2 of the present invention.

FIG. 6 shows the configuration of a simulator of Embodiment 2 of the present invention. The simulator in FIG. 6 is the same as that in FIG. 1 except that the event counter 2 shown in FIG. 1 is replaced by an event incident calculator 9. The event incident calculator 9 calculates an event incident rate in each functional module from the simulation results by the simulation method 1. The event incident calculator 9 counts the changes in the signal value occurring in each signal with respect to the monitored results of all the signal lines in the functional module. The measured number of the changes is used as the number of events of each signal. The event incident rate is obtained by dividing the number of events by (the number of the total signal lines)×(the simulation unit time with the first test vector set).

Next, the flow of the simulation control by the controller 10 shown in FIG. 6 will be described with reference to FIG. 7. In the first step S1 in FIG. 7, simulation is performed with the first test vector set, and the incident rate of events occurring in each module is calculated. In the second step S2, a simulation method is selected for each functional module based on the event incident rate calculated in step S1. Then, simulation is performed with the second test vector set. The first step S1 includes two steps S11 and S12. In step S11, simulation is performed with respect to all the functional modules that are input and hardware-described in the mode where signal value changes on all the signal lines of each functional module are monitored using the event-driven simulation method 11 as shown in FIG. 6. Thus, the monitored results are stored. Next, in step S12, the numbers of events on the signal lines are counted for each functional module, and the event incident rate is calculated.

Then, the flow advances to step S2, which includes two steps S21 and S22. In step S21, a simulation method is selected for each functional module. FIG. 8 shows a detailed flow of the processing for each functional module. Referring to FIG. 8, the event incident rate and the reference event incident rate of the functional modules are input in step S211 and compared in S212. In step S213, the cycle simulation method 12 is selected for the functional module having an event incident rate larger than the reference event incident rate. In step S214, the event-driven simulation method 11 is selected for the other functional modules. In step S22 in FIG. 7, integrated simulation is performed by the event-driven simulation method 11 and the cycle simulation method 12.

Next, the operation of Embodiment 2 will be described by way of a specific example in FIG. 4. The process of calculating the event incident rate of the functional module A will de described below. The following process is the same as that in Embodiment 1.

Figure 5:
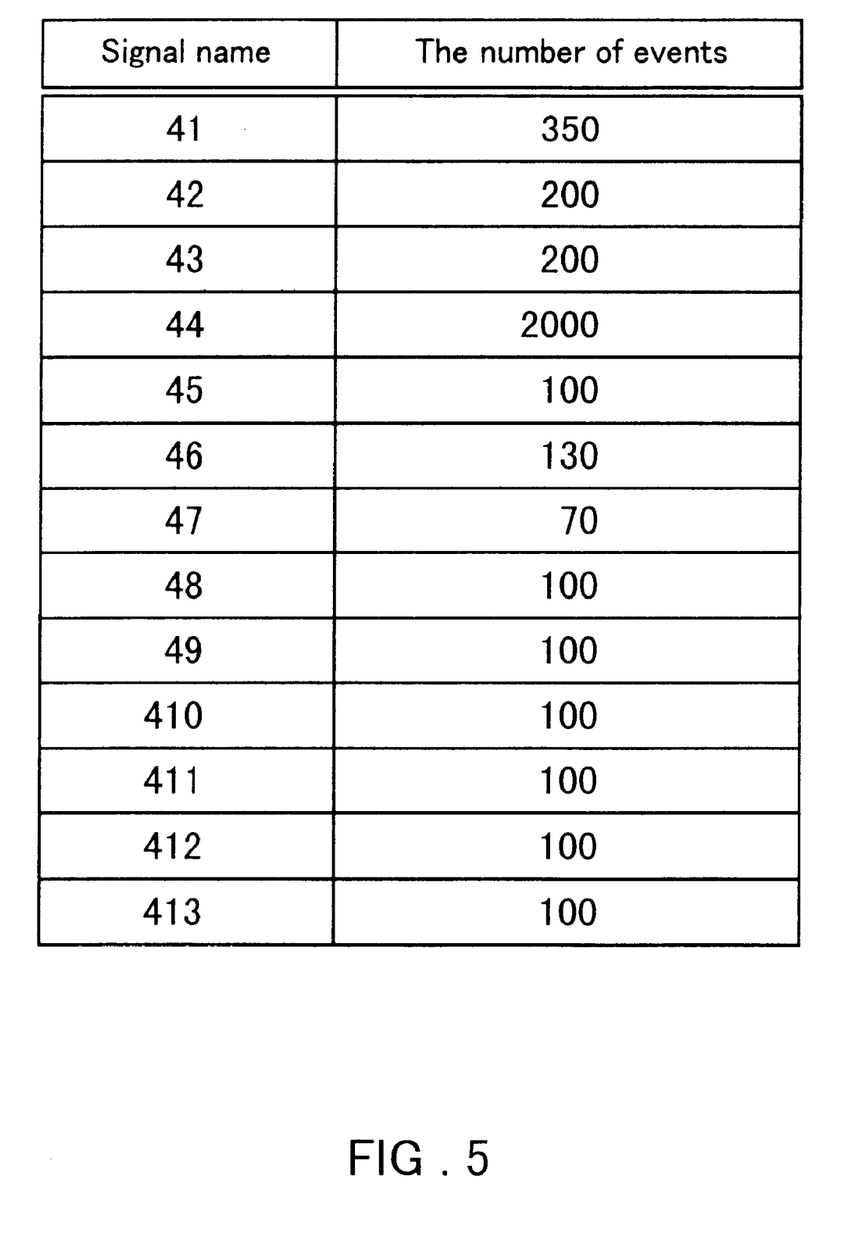
FIG. 5 is a diagram showing illustrative results of counting the number of events for illustrating the operation of the simulator of Embodiment 1 of the present invention.

In the first step, simulation is performed with respect to the circuits in FIG. 4 with the first test vector set. As the monitored results for the functional module A, it is assumed that the same number of events as those in the table in FIG. 5 are obtained. When the sum of the numbers of events for all the signals of the functional module A is calculated, the event count value of the functional module A amounts to 3650. Next, 1000 is taken as the simulation unit time with the first test vector set with 1000 cycles (i.e., one cycle is one simulation time unit). The total number of the signals of the functional module is 13. Thus, the event incident rate is calculated as follows: $3650 \div (13 \times 1000) = 0.28 = 28\%$. In this case, when 30% is taken as the reference event incident rate in the second step, the event-driven simulation method is selected as the simulation method for the functional module A.

According to the configuration and the procedures as described above, the event-driven simulation is performed with the short test vector in the first step so that the functional modules are distinguished on the basis of the event incident rate. The cycle-based simulation is automatically performed for the functional module that has been determined to have a high event incident rate. On the other hand, the event-driven simulation is automatically performed for the functional module that has been determined to have a low event incident rate. The determination on the basis of the event incident rate is particularly advantageous, because the operation status of the circuit can be judged in view of the scale of the functional module and the simulation time. In the case of a large-scale functional module or when a test vector with a relatively large number of cycles is used, only a part of the circuit may operation even if there are many events. In this case, according to this embodiment, the event-driven method is selected, which is advantageous in view of the simulation speed.

This embodiment allows the designer to perform simulation of the large-scale system LSI in a shorter time by combining the simulation methods appropriately without detailed investigation on the characteristics of the circuit operation or the test vector.

Figure 7:
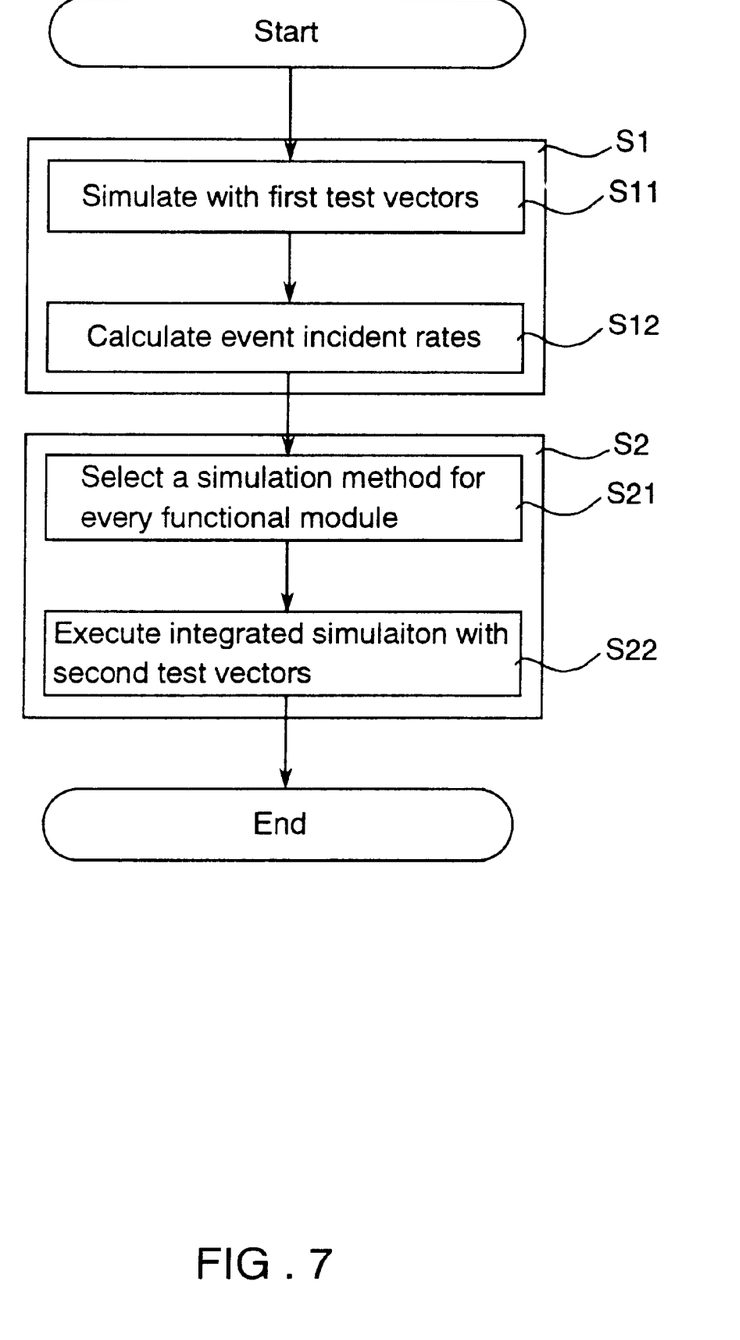
FIG. 7 is a flow chart of the simulation control of the simulator of Embodiment 2 of the present invention.
Figure 8:
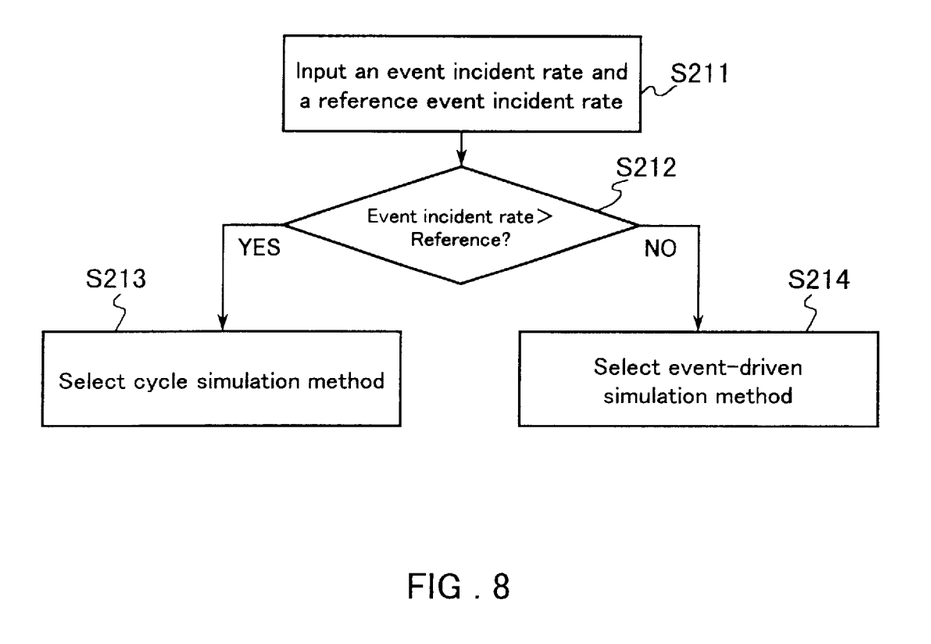
FIG. 8 is a flow chart of the simulation control of the simulator of Embodiment 2 of the present invention.

In the first step S1 in FIG. 7, the event incident rate can be calculated only with respect to the input signals to the functional modules. In this case, the configuration and the procedure are the same as above. However, since only the input signals are monitored, the simulation in the first step can be performed faster and the data region required for the monitored results for counting events can be reduced.

Furthermore, in the first step S1 in FIG. 7, the event incident rate can be calculated only with respect to the clock input signals to the functional modules. In this case, the configuration and the procedure is the same as above. In this embodiment, comparing with the preceding embodiment, the simulation in the first step can be performed even faster and the data region required for the monitored results for counting events can be reduced further. In the simulation in the second step S2, the simulation methods can be switched in response to the clock pulses or the stop of the clock signal.

Embodiment 3

Embodiment 3 is intended to achieve high-speed simulation of a long-term and complicated operation of a circuit by changing the simulation methods for each functional module during the simulation in accordance with the operation status, i.e., the event incident status, of each of the functional modules constituting the circuit.

Embodiment 3 can achieve high-speed simulation by monitoring the event incident status of the functional modules periodically for a constant duration of time during the execution of simulation so as to change the simulation methods, if necessary. In this case, a designer who carries out the simulation designates an interval of times for monitoring the event incident status during the simulation as a re-evaluation interval by nano-second units or the like. The designer also designates a duration during which the event incident status of each functional module is monitored as an evaluation duration by nano-second unit or the like.

Figure 9:
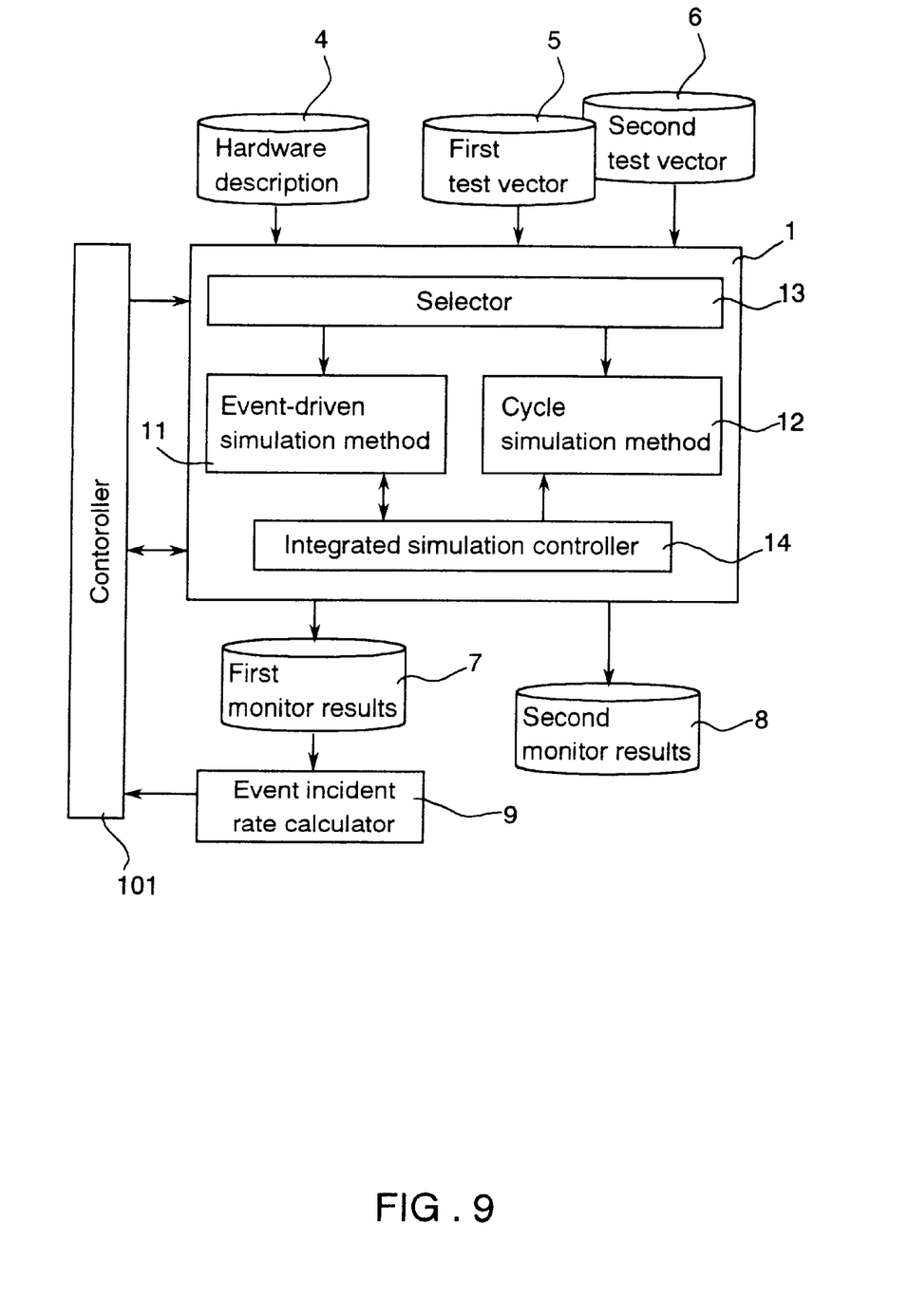
FIG. 9 shows the configuration of a simulator of Embodiment 3 of the present invention.

FIG. 9 shows the configuration of a simulator of Embodiment 3 of the present invention. The simulator in FIG. 9 is the same as that in FIG. 6 except that the controller 10 in FIG. 6 is replaced by a new controller 101. The controller 101 controls the execution and the stop of the simulation while monitoring the simulation time controlled by the integrated simulation method of the simulation method 1.

Next, the flow of the simulation control by the controller 101 shown in FIG. 9 will be described with reference to FIG. 10. In the first step S1 in FIG. 10, simulation is performed with the first test vector set, and the incident rate of events occurring in each module is calculated. In the second step S2, a simulation method is selected for each functional module based on the event incident rate calculated in step S1. Then, simulation is performed with the second test vector set. The first step S1 includes two steps S11 and S12. In step S11, simulation is performed with respect to all the functional modules that are input and hardware-described in the mode where signal value changes on all the signal lines of each functional module are monitored using the event-driven simulation method 11 as shown in FIG. 9. Thus, the monitored results are stored. Next, in step S12, the numbers of events on the signal lines are counted for each functional module, and the event incident rate is calculated.

Then, the flow advances to step S2, which includes two steps S21 and S22. In step S21, a simulation method is selected for each functional module. The detailed flow of the processing for each functional module in step S21 is the same as described with reference to FIG. 8.

Figure 10:
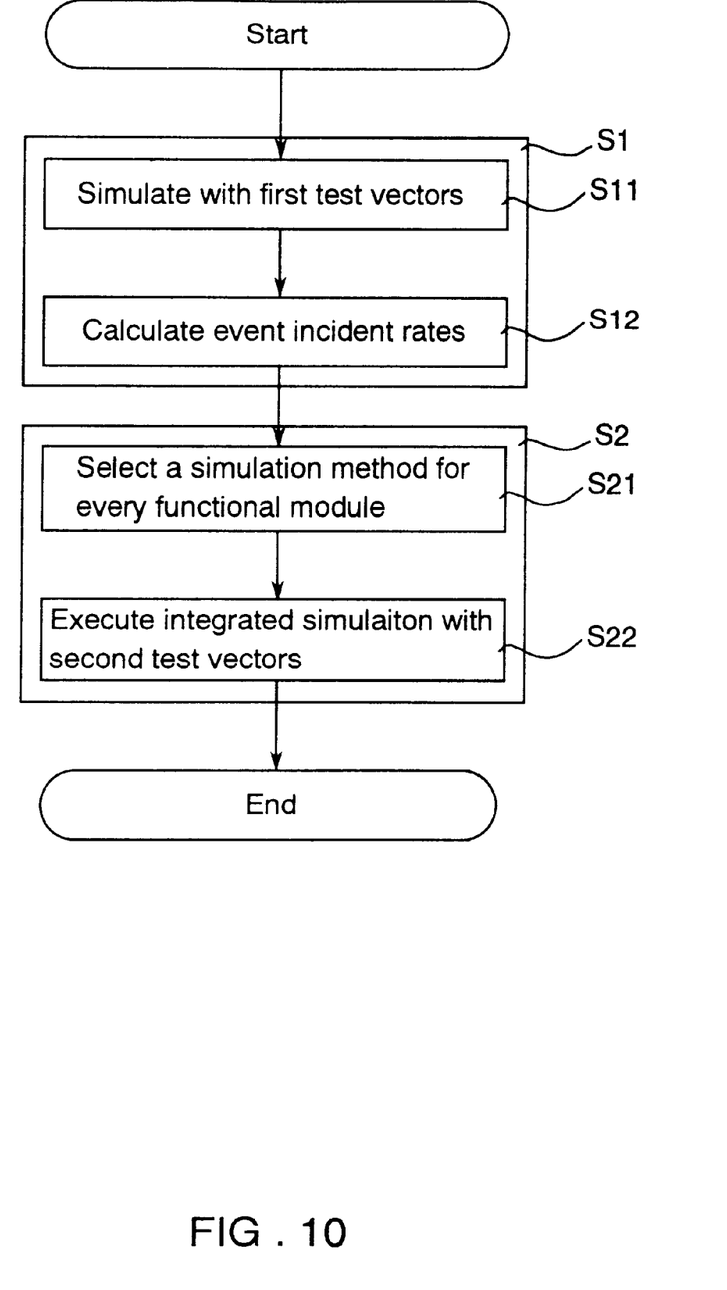
FIG. 10 is a flow chart of the simulation control of the simulator of Embodiment 3 of the present invention.

In step S22 in FIG. 10, integrated simulation is performed by the event-driven simulation method 11 and the cycle simulation method 12. A detailed flow of the processing in step S22 will be described with reference to FIG. 11. First, in step S221 in FIG. 11, a re-evaluation interval and an evaluation duration are input. The re-evaluation interval is an interval of simulation time at which the re-calculation of the even incident rate states. The evaluation duration is a period during which simulation is performed for calculation of the event incident rate. Then, integrated simulation is performed (step S222). During this period, the controller 101 monitors a lapse of the simulation time (step S223). When the simulation time corresponding to the re-evaluation interval has lapsed (step S224), the integrated simulation is stopped temporarily and all the operation statuses of the LSI that is being simulated are backed up (step S225). Then, all signals of the LSI that is being simulated are traced (step S226), and simulation is performed by the event-driven simulation method 11 (step S227). In the simulation in step S227, the operation statuses that have been backed up in step 225 are uploaded, and simulation is performed for the evaluation duration that has been input in step S22. When the simulation is completed, the event incident rate of each functional module of the LSI is calculated in step S228 in the same manner as in step S12 in FIG. 10, so that the simulation method for each functional module is re-selected in step S229. Step S229 is performed in the same manner as step S21. Then, the flow returns to step S221, and integrated simulation is resumed. The integrated simulation at the second time and the subsequent integrated simulations are performed after the back-up operation statuses are uploaded. The processes shown in FIG. 11 as described above are performed until the simulation with the second test vector set is completed.

Figure 12:
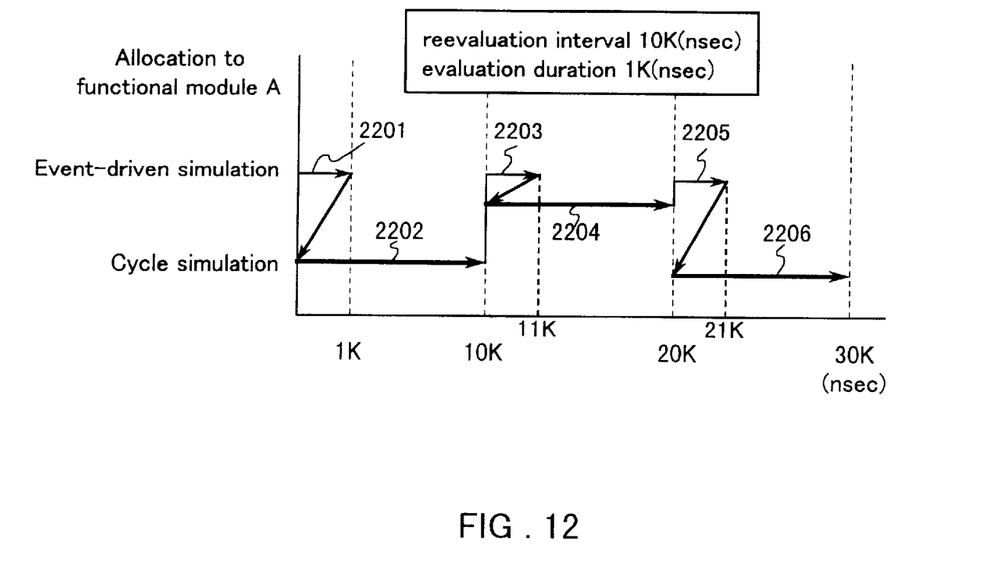
FIG. 12 shows an illustrative control timing for illustrating the operation of Embodiment 3 of the present invention.

Next, the operation of Embodiment 3 will be described by way of a specific example in FIG. 4. FIG. 12 is a timing chart of an example when the simulation method is selected for the functional module A among the four functional modules constituting the LSI to be simulated shown in FIG. 4 in. Embodiment 3. In the example in FIG. 12, simulation is performed with the second vector for 30K (nsec), and the simulation time with the first test vector set is 1K (nsec). The re-evaluation interval is 10K (nsec). During a period 2201 shown in FIG. 12, the event-driven simulation is performed with the first test vector set. As a result, the event incident rate of the functional module A is calculated so that the simulation method is selected. During a period 2202 of 10K (nsec), the cycle simulation is performed with respect to the functional module A with the second test vector set. The simulation methods are switched at the end of the re-evaluation interval of 10K (nsec) so that the event-driven simulation is performed with respect to the functional module A for a period 2203 of 1K (nsec) and the event incident rate is re-evaluated. As a result, the event-driven method is selected, and the event-driven simulation is performed for a period 2204 from 10K (nsec) to 20K (nsec). Similarly, the functional module A simulated in the event-driven method for a period 2205 and the event incident rate is re-evaluated. As a result, the cycle-based method is selected, and the cycle simulation is performed for a period 2206 from 20K (nsec) to 30K (nsec).

According to the configuration and the procedures as described above, the event-driven simulation is performed with the short test vector in the first step so that the functional modules are distinguished on the basis of the event incident rate. The cycle-based simulation is automatically performed for the functional module that has been determined to have a high event incident rate. On the other hand, the event-driven simulation is automatically performed for the functional module that has been determined to have a low event incident rate.

Furthermore, after a predetermined time has lapsed, the selection index for each functional module is re-calculated based on the operation status of the LSI that is being simulated so that the simulation method is re-selected. This embodiment is particularly advantageous in the case where the operation status is significantly changed in the simulation of the long-term and complicated operation of the circuit, because it is possible to adopt an optimal simulation method in response to the change in the operation status. For example, when a clock signal stops in a functional module during simulation, the cycle simulation method is automatically switched to the event-driven simulation.

A designer who carries out the simulation sets a time interval during which a change in the operation mode of a circuit to be simulated is anticipated in accordance with a circuit operation scenario for simulation as the re-evaluation interval. Furthermore, the designer sets a duration sufficient to monitor an average event incident status as the evaluation duration. The same simulation results are obtained regardless of the re-evaluation interval and the evaluation duration. On the other hand, the simulation time depends on the re-evaluation interval and the evaluation duration. Therefore, the simulation can be performed even faster by adjusting the re-evaluation interval and the evaluation duration.

This embodiment allows the designer to perform simulation of the large-scale system LSI in a shorter time by combining the simulation methods appropriately without detailed investigation on the characteristics of the circuit operation or the test vector.

Figure 11:
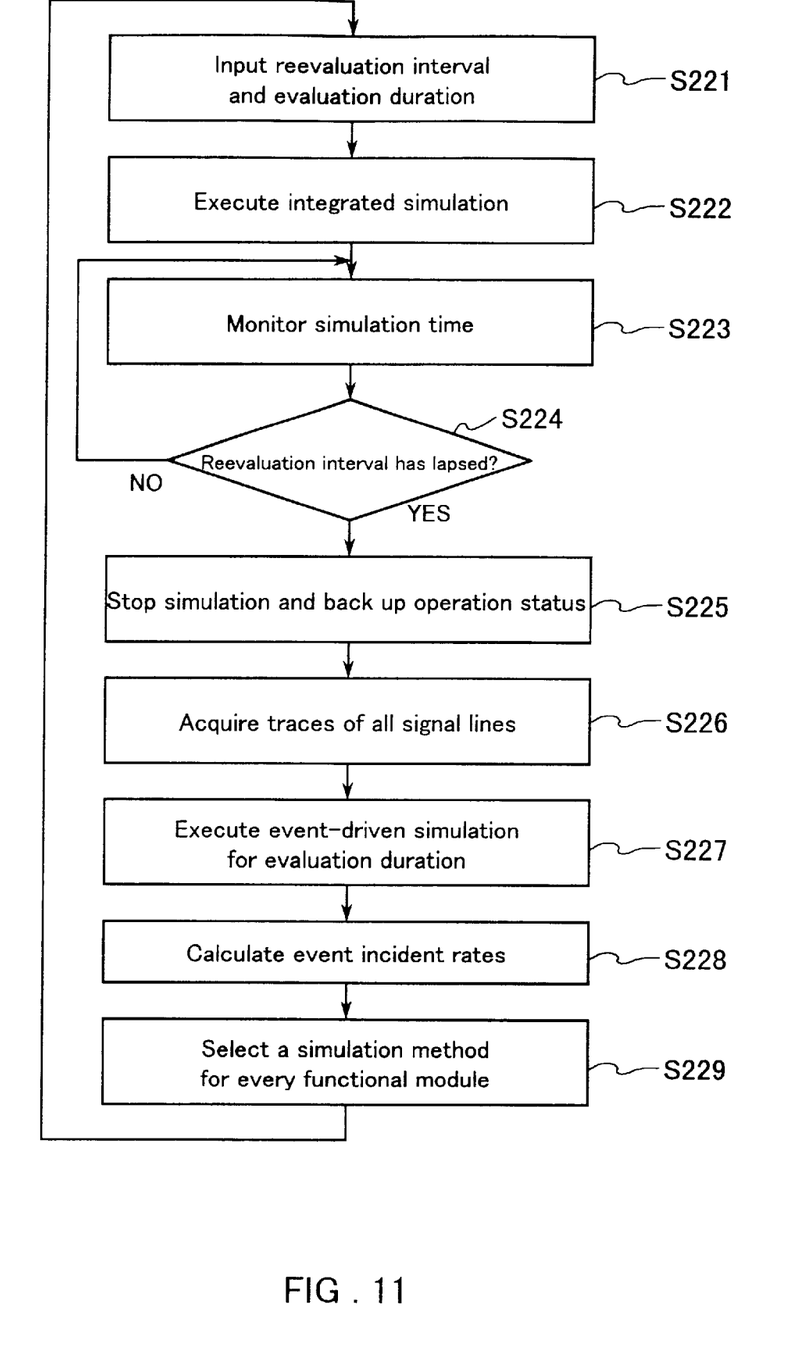
FIG. 11 is a flow chart of the simulation control of the simulator of Embodiment 3 of the present invention.

In step S228 in FIG. 11, the event incident rate can be calculated only with respect to the clock input signals to the functional modules. In this case, the configuration and the procedure is the same as above. In this embodiment, comparing with the preceding embodiment, the event-driven simulation in step S227 in FIG. 11 for re-calculation of the event incident rate can be performed faster and the data region required for the monitored results for counting events can be reduced further.

Figure 13:
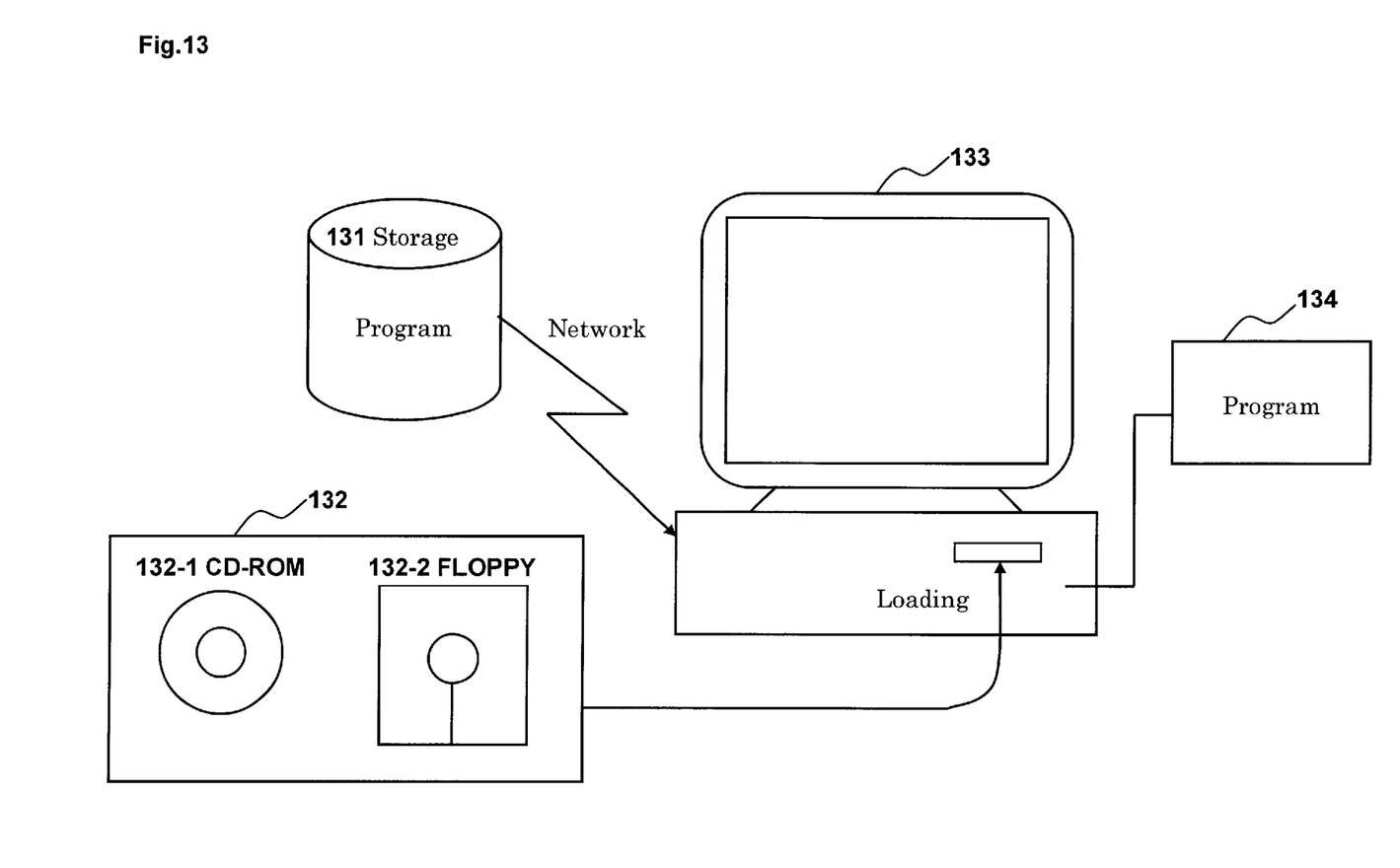
FIG. 13 is a diagram showing an example of a recording medium of the present invention.

A recording medium in which programs for realizing the simulator of the present invention are recorded can be not only a transportable recording medium 132 such as a CD-ROM 132-1, or a floppy disk 132-2, but also a remote accessible storage apparatus 131 or an equipped storage medium such as a hard disk and a RAM of a computer, as shown in FIG. 13. The program 134 is loaded into the main memory of a data processing apparatus 133, and executed.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A simulator comprising:
   means for counting a number of events occurring in each of functional modules constituting an LSI and means for calculating an index value for selecting a simulation method for each functional module in a particular simulation of an operation of the LSI with a first test vector set;
   means for selecting one simulation method among a plurality of simulation methods for each functional module based on the selection index value; and
   means for controlling execution of simulation of the LSI operation with a second test vector set in the simulation method selected for each functional module.

2. The simulator according to claim 1, wherein the plurality of simulation methods comprise:
   a cycle simulation method in which the functional modules are simulated in a clock signal cycle; and
   an event-driven simulation method in which the functional modules are simulated in an event-driven manner.

3. The simulator according to claim 1, wherein the number of events that has been counted during a predetermined period of time is used as the selection index value.

4. The simulator according to claim 1, wherein an event incident rate obtained by dividing the counted number of events by a product of a circuit scale of a functional module and a simulation unit time is used as the selection index value.

5. The simulator according to claim 1, wherein the control means controls such that:
   the simulation with the second test vector set is stopped temporarily after a predetermined period of time has lapsed;
   the selection index value is re-calculated;
   the simulation method for each functional module is selected among the plurality of simulation methods based on the recalculated selection index value; and the simulation of the LSI operation with the second test vector set that has been stopped temporarily is resumed.

6. The simulator according to claim 5, wherein the selection index value calculating means counts the number of event only with respect to an input signal.

7. The simulator according to claim 5, wherein the selection index value calculating means counts the number of event only with respect to a clock signal.

8. A computer-readable recordable medium having a program for execution on a computer recorded thereon, the program comprising steps of:
   counting a number of events occurring in each of functional modules constituting an LSI so as to calculate an index value for selecting a simulation method for each functional module in a particular simulation of an operation of the LSI with a first test vector set;
   selecting one simulation method among a plurality of simulation methods for each functional module based on the selection index value; and simulating the LSI operation with a second test vector set in the simulation method selected for each functional module.

* * * * *